United States Patent
Douglas

(10) Patent No.: US 10,422,056 B2
(45) Date of Patent: Sep. 24, 2019

(54) STRUCTURE OF FABRIC AND ELECTRONIC COMPONENTS

(75) Inventor: Alexander Ulrich Douglas, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1153 days.

(21) Appl. No.: 12/279,224

(22) PCT Filed: Feb. 12, 2007

(86) PCT No.: PCT/IB2007/050446
§ 371 (c)(1),
(2), (4) Date: Aug. 13, 2008

(87) PCT Pub. No.: WO2007/093947
PCT Pub. Date: Aug. 23, 2007

(65) Prior Publication Data
US 2009/0025819 A1    Jan. 29, 2009

(30) Foreign Application Priority Data

Feb. 15, 2006    (EP) .................................... 06101718

(51) Int. Cl.
*D03D 1/00* (2006.01)
*D03D 15/00* (2006.01)
(Continued)

(52) U.S. Cl.
CPC .............. *D03D 15/00* (2013.01); *D02G 3/441* (2013.01); *D03D 1/0088* (2013.01);
(Continued)

(58) Field of Classification Search
CPC .............. D03D 1/0088; Y10T 442/107; Y10T 442/3976
(Continued)

(56) References Cited

U.S. PATENT DOCUMENTS 6,080,690 A    6/2000  Lebby et al.
6,210,771 B1   4/2001  Post et al.
(Continued)

FOREIGN PATENT DOCUMENTS

DE          10307505 A1    9/2004
WO          03094719 A1    11/2003
WO    WO 2004076731 A1 *  9/2004

OTHER PUBLICATIONS

Kristof Van Laerhoven, et al: A Layered Approach Database Accession No. 7832642 [Online] The Institution of Electrical Engineers, Stevenage, GB; IEEE Eurowearable, pp. 61-66, (no date).
(Continued)

*Primary Examiner* — Andrew T Piziali

(57) ABSTRACT

A structure comprises a fabric (28) with electronic components (10, 12) mounted thereon. The fabric (28) comprises a warp and weft of fibers (30, 32), each of the warp and weft comprising a combination of electrically conducting fibers (30) and electrically non-conducting fibers (32). The electronic components (10, 12) are connected to at least one electrically conducting fiber (30). The electronic components, in a preferred embodiment comprise a plurality of end of line elements (10) and a corresponding plurality of groups of line elements (12), each group of line elements (12) connected to an end of line element (10).

14 Claims, 6 Drawing Sheets

Figure 1:
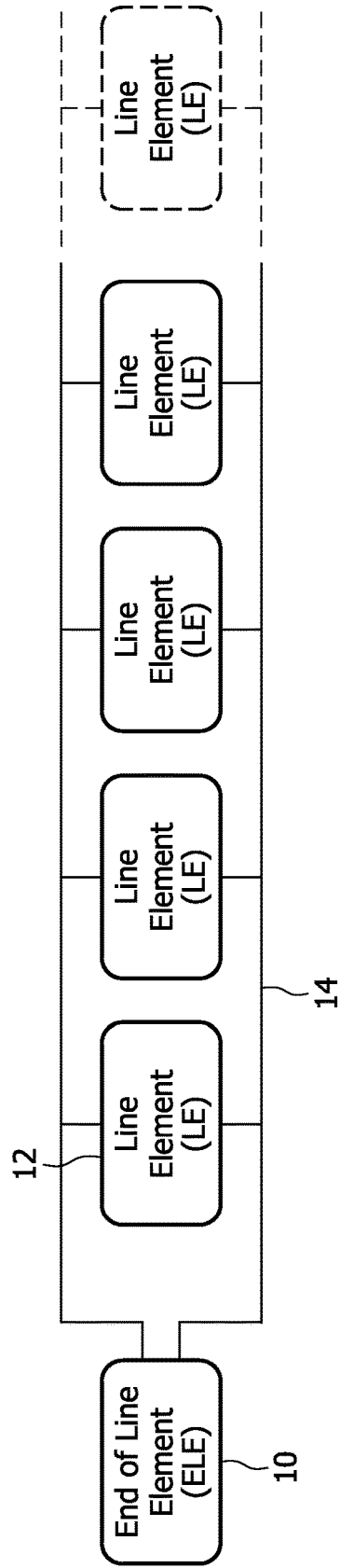

(51) Int. Cl.
*D02G 3/44* (2006.01)
*H05K 1/03* (2006.01)
*A41D 1/00* (2018.01)

(52) U.S. Cl.
CPC ......... *D03D 15/0066* (2013.01); *H05K 1/038* (2013.01); *A41D 1/002* (2013.01); *D10B 2101/20* (2013.01); *D10B 2201/02* (2013.01); *D10B 2331/04* (2013.01); *D10B 2401/16* (2013.01); *D10B 2501/00* (2013.01); *H05K 2201/029* (2013.01); *H05K 2201/0281* (2013.01)

(58) Field of Classification Search
USPC .................................. 442/203, 217, 228, 301
See application file for complete search history.

(56) References Cited

U.S. PATENT DOCUMENTS

| | | |
|---|---|---|
| 6,381,482 B1 | 4/2002 | Jayaraman et al. |
| 6,888,112 B2 | 5/2005 | Rock et al. |
| 2004/0009729 A1 | 1/2004 | Hill et al. |
| 2006/0035554 A1* | 2/2006 | Glaser et al. ................. 442/301 |

OTHER PUBLICATIONS

Zahi Nakad, et al: Fault-Tolerant Networks for Electronic Textiles, Bradley Department of Electrical and Computer Engineering, Virginia Polytechnic Institute & State University, (no date).

Diana Marculescu, et al: Electronic Textiles: A Platform for Pervasive Computing, Proceedings of the IEEE, vol. 91, No. 12, Dec. 2003, pp. 1995-2018.

Diana Marculescu, et al: Challenges and Opportunities in Electronic Textiles Modeling and Optimization, Department of Electrical and Computer Engineering, Carnegie Mellon University, Jun. 10-14, 2002, pp. 1-6.

Van Laerhoven, K. et al., "A layered approach to wearable textile networks", 2003, IEE Eurowearable, p. 61-66.

* cited by examiner

Top view

Cross section

STRUCTURE OF FABRIC AND ELECTRONIC COMPONENTS

This invention relates to a structure comprising a fabric of a plurality of fibres and a number of electronic components mounted on the fabric. The fabric of the structure may be produced by weaving. The invention also relates to a method of operating the structure as a network of electronic components and connecting conductors.

Textiles are used in everyday life. When textiles and electronics are integrated, new application fields emerge. The integration of electronic components into clothing is becoming an increasingly important area in the field known as wearable computing. Progress in coating and weaving techniques have enabled industry and research to produce durable threads and textiles that are highly conductive and as flexible as regular fabric. Garments are possible that can measure biometric characteristics, such as the temperature of the user, as the garment is being worn. Such data can be used in, for example, medical and athletic applications, where a person's vital statistics are monitored.

For example, International Patent Application Publication WO 03/094719 discloses a woven electronic textile, yarn and article. The woven article comprises a plurality of electrically insulating and/or electrically conductive yarn in the warp and a plurality of electrically insulating and/or electrically conductive yarn in the weft, interwoven with the yarn in the warp. A functional yarn in the warp and/or the weft comprises an elongate substrate including at least one electrical conductor and at least one electronic device thereon, wherein the electrical conductor provides directly and/or indirectly an electrical contact for connecting to the electronic device.

The methodology used in the technology described in this document has a number of disadvantages. For example, the electronic devices have to be mounted on the substrate that is woven into the fabric before the article is made. This severely limits the choice of devices for use in the fabric, as the selected devices will have to be relatively small and extremely robust to survive the weaving process. The fabric will either have to be redesigned for every application for which it is to be used, or a generic fabric will have to be created for all applications that will likely have redundant components in many situations. Either of these solutions is expensive. It is also the case that the resulting fabric does not have good fault tolerance as failures in the substrates supporting the devices after manufacture into a finished article will result in failure of the article to carry out its function.

A different system is disclosed in U.S. Pat. No. 6,080,690, which shows a textile fabric with an integrated sensing device and clothing fabricated from the fabric. The textile fabric includes a plurality of electrically conductive fibres and at least one electronic sensor or a plurality of sensing fibres. The textile fabric is intended for fabrication into a functional article of clothing or other item made of the woven textile fabric, so as to increase the functionality of the article of clothing.

The fabric discussed in this document is intended to assist a wearer in the monitoring of biomedical information and/or environmental conditions existent upon the wearer. The plurality of electrically conductive fibres and sensing devices are characterized as creating an interconnect to a portable electronic monitoring device, or integrated components such as heating and cooling bands, electronics, or the like, or for serving as an antenna for signals received and transmitted between an integrated electronic component and a remote monitoring device.

A number of weaknesses are present in the fabric disclosed in this prior art document. The fabric is made of a weave of (insulated) conducting fibres and (non-insulated) sensing fibres with electronic components such as displays mounted on the fibres. While this is a simple fabric to manufacture, any component mounted has to penetrate the insulating layer of the conducting fibre in order to be connected to such a fibre, which is unnecessarily complicated and less tolerant manufacturing process. While components mounted connect directly to sensing fibres that monitor data such as body temperature, there is no method for a mounted component to communicate with another component. As before, the final garment is not fault tolerant. For example, if a fault occurs on a conducting fibre that has a component mounted thereon, then this component will be non-functioning.

A further method for mounting electronic components on a garment is disclosed in "A Layered Approach To Wearable Textile Networks" by Kristof Van Laerhoven, Nicolas Villar and Hans-Werner Gellersen of the Department of Computing of Lancaster University. This paper introduces a functioning prototype of a flexible network that allows communication between wearable components, but is also able to supply power to them. An arrangement of layered textiles is used, as opposed to the more traditional routed circuitry layout, which results in a novel approach towards the concept of a flexible clothing network.

The garment disclosed in this paper has three laminate layers, outer and inner conducting layers, with an insulating layer in between. Components are provided with two pins of differing lengths that are pinned to the laminate. The shorter pin communicates with the outer layer and the longer pin penetrates through to the inner layer. Such a laminate garment is impractical in many situations for a user, and does not support a simple manufacturing process, as it cannot be manufactured by weaving. No fault tolerance is provided by the garment in the event that one or more components are non-functioning.

Textiles are subjected to wear and tear on a daily basis. This means that any electronics integrated into a textile will also be subjected to this degradation process. To make an electronic system integrated into a textile fault tolerant, the system must have extra functionality. Some properties of modern textiles are that they are produced at low cost and their production is a continuous process that runs at high rates.

Printed circuit boards, and other traditional carriers for electronic components which use photolithographic techniques, can cope with arbitrary patterns on planar metallic layers. Woven textiles do not allow such a large degree of freedom in the design. They often require a continuous line in both the warp and in the weft direction.

A known technique for a textile is to use a conductive yarn in the warp and weft direction to produce a woven matrix that consists of rows and columns. If n rows and m columns are used, then nm elements can be addressed. There are a number of disadvantages, however, when using such a woven matrix.

For a matrix of n rows and m columns, n+m connections are needed between the matrix and the controller/driver of the matrix. This requires surface area on the fabric, which could otherwise be used for more elements, or to reduce the surface area of the overall design. The applications for the woven matrix are limited by the fact that the size and layout are defined at design time of the fabric. The elements to be used in the matrix have to be at the intersections of the rows and columns. The connections between the matrix and the driver are fixed, and thus the woven matrix will be designed with a certain application and dimensions in mind.

To illustrate the inconvenience of this woven matrix, a garment such as a shirt can have sensors integrated into it, to measure several bodily functions, such as heart rate and respiration. To make such a shirt one first has to know where to place the sensors on the shirt, and then design a matrix for that shirt. For a person of a different size this shirt might be too small or too big. Thus, another shirt is required, requiring another matrix design. In other words, the woven matrix cannot be cut to measure. In addition, such a design has a lot of redundancy and is complicated to manufacture.

It is therefore an object of the invention to improve upon the known art.

According to a first aspect of the present invention, there is provided a structure comprising a fabric and electronic components mounted thereon, the fabric comprising a warp and weft of fibres, each of the warp and weft comprising a combination of electrically conducting fibres and electrically non-conducting fibres, each electronic component connected to at least one electrically conducting fibre.

According to a second aspect of the present invention, there is provided a method of operating a structure, the structure comprising a fabric and electronic components mounted thereon, the fabric comprising a warp and weft of fibres, each of the warp and weft comprising a combination of electrically conducting fibres and electrically non-conducting fibres, each electronic component connected to at least one electrically conducting fibre, the method comprising powering the electronic components via the electrically conducting fibres and communicating between the electronic components via the electrically conducting fibres.

Owing to the invention, it is possible to provide a structure that by super imposing the communication between the components in a system and the power supply to these components, the total wiring of the system is greatly reduced. This results in the possibility to reduce the surface area of the overall design.

The design of the structure as described above allows the fabric can cope with cut to measure, since the structure can be completed after the fabric has been cut. The small amount of wiring between the structural components allows a simple generic textile design layout, which fits with the warp and weft directions of a weaving machine.

The invention also supports a system that can detect at run time, which elements of the system are operational, while keeping the wiring of the system simple. Because of this simple wiring scheme, a generic layout compatible with weaving machinery can be made.

Preferably, the structure further comprises at least one electrically conductive bridge component connecting a pair of electrically conducting fibres. By using one or more bridges a relatively complicated connection layout of the components can be achieved. The possibilities for the shape of the fabric that can be used as a substrate for the electronic components is greatly increased by the use of bridge components.

Advantageously, the electronic components comprise a plurality of end of line elements and a corresponding plurality of groups of line elements, each group of line elements being connected to an end of line element, and each end of line element being connected to an adjacent end of line element. The grouping of the components into logical cells consisting of a group of line elements connected to an end of line element supports a simple and efficient creation of independent but interconnected functional blocks.

Ideally, a group of line elements are connected in parallel to the respective end of line element and each end of line element is arranged to query each line element, to which it is directly connected. Partial power failure, and thus communication failure, can be detected at run-time. This gives the electronic system embodied in the structure of the fabric and components the possibility of looking for an alternative way of achieving its function.

Preferably, the structure further comprises a power source connected to a pair of electrically conducting fibres and the power source is connected to multiple independent pairs of electrically conducting fibres. The use of multiple connections for the power supply to the network of electronic components, via the electrically conducting fibres, further improves the fail-safe nature of the structure.

Embodiments of the present invention will now be described, by way of example only, with reference to the accompanying drawings, in which:—

Figure 2:
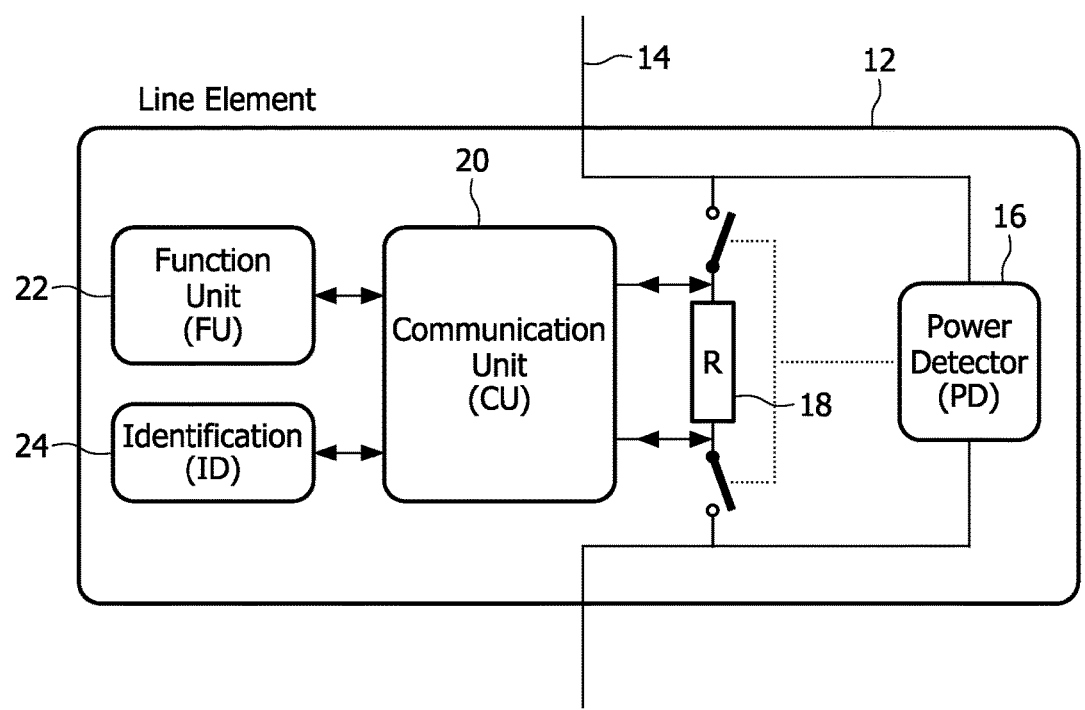
Figure 3:
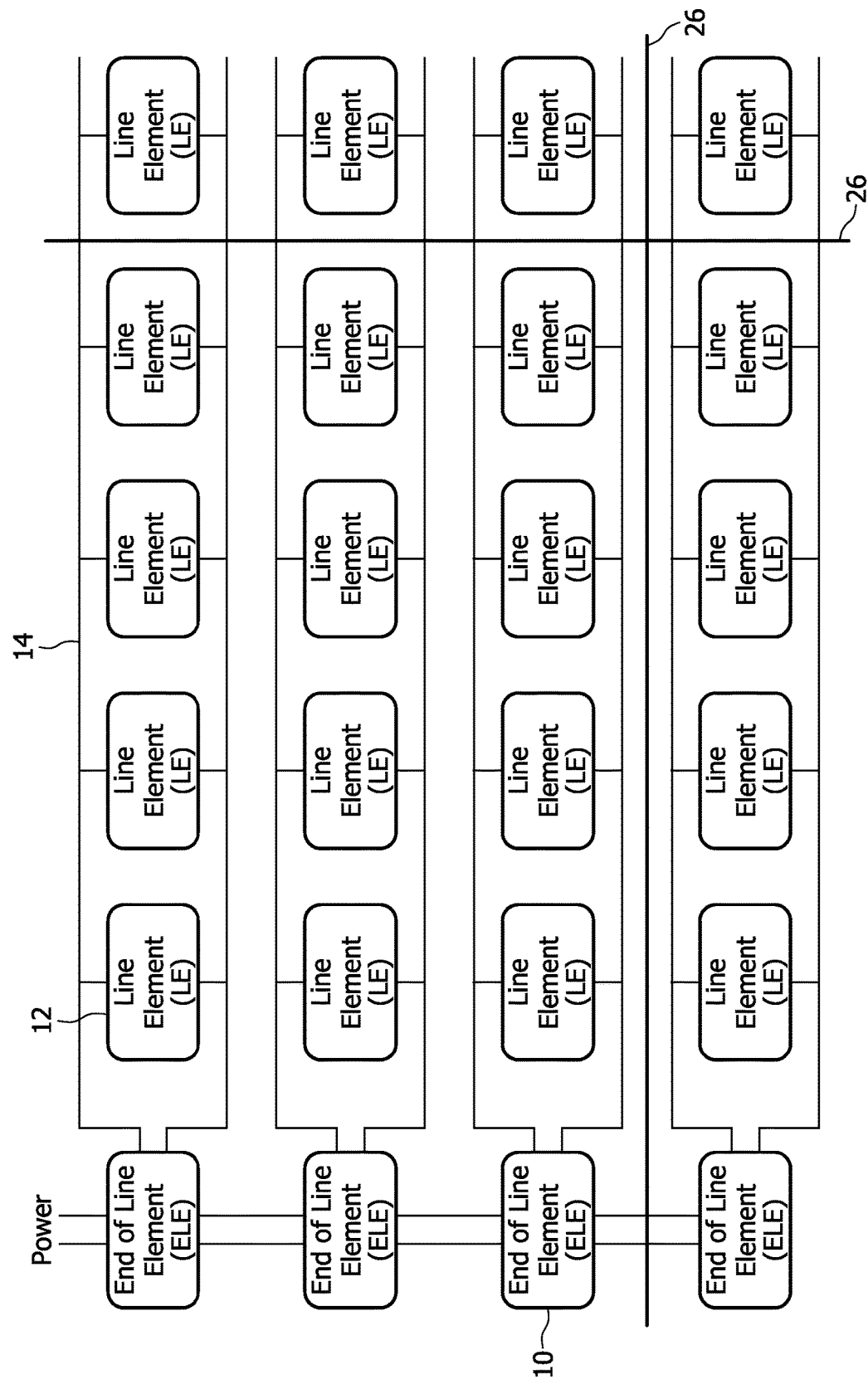
Figure 4:
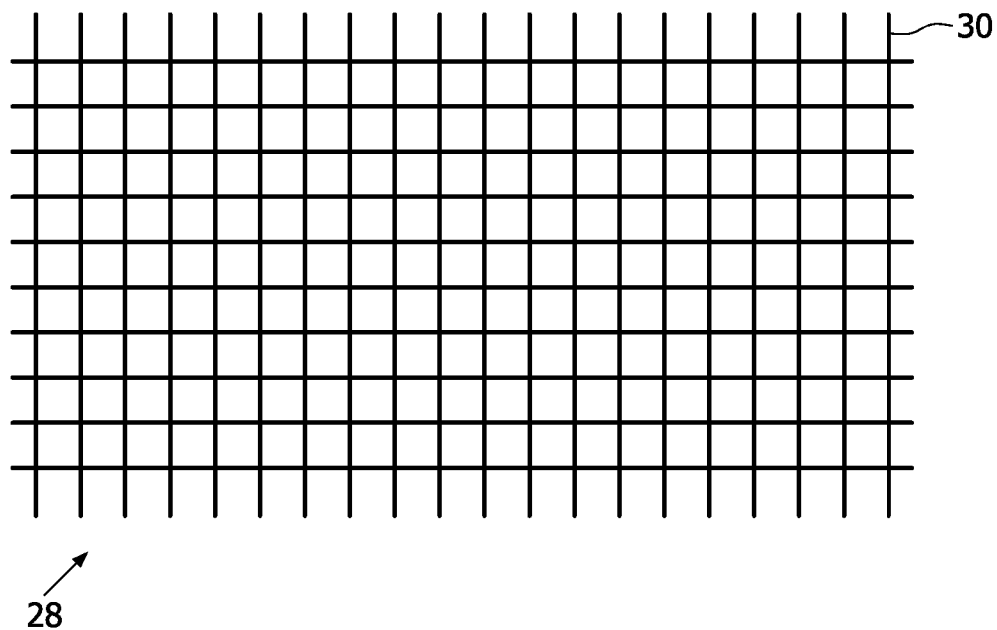
Figure 5:
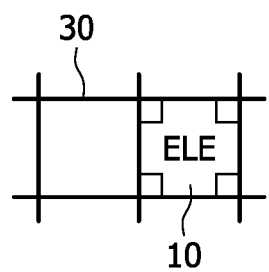
Figure 5:
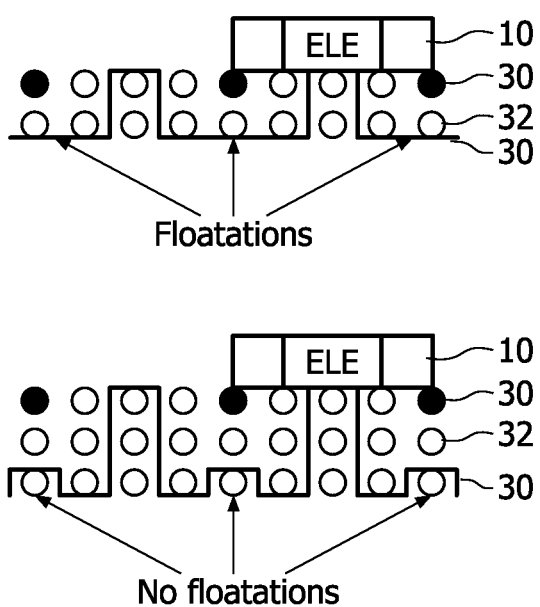
Figure 6:
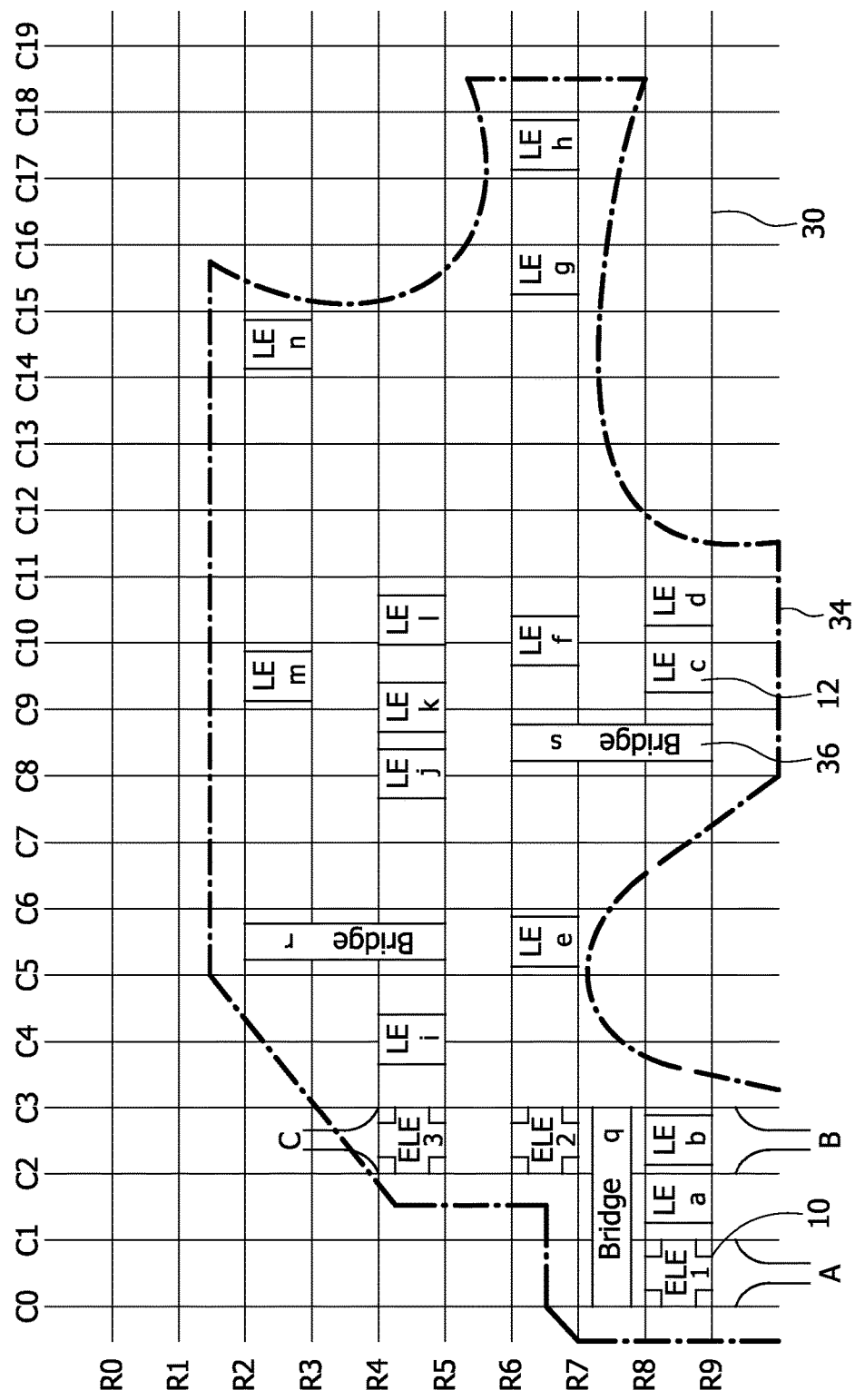
Figure 7:
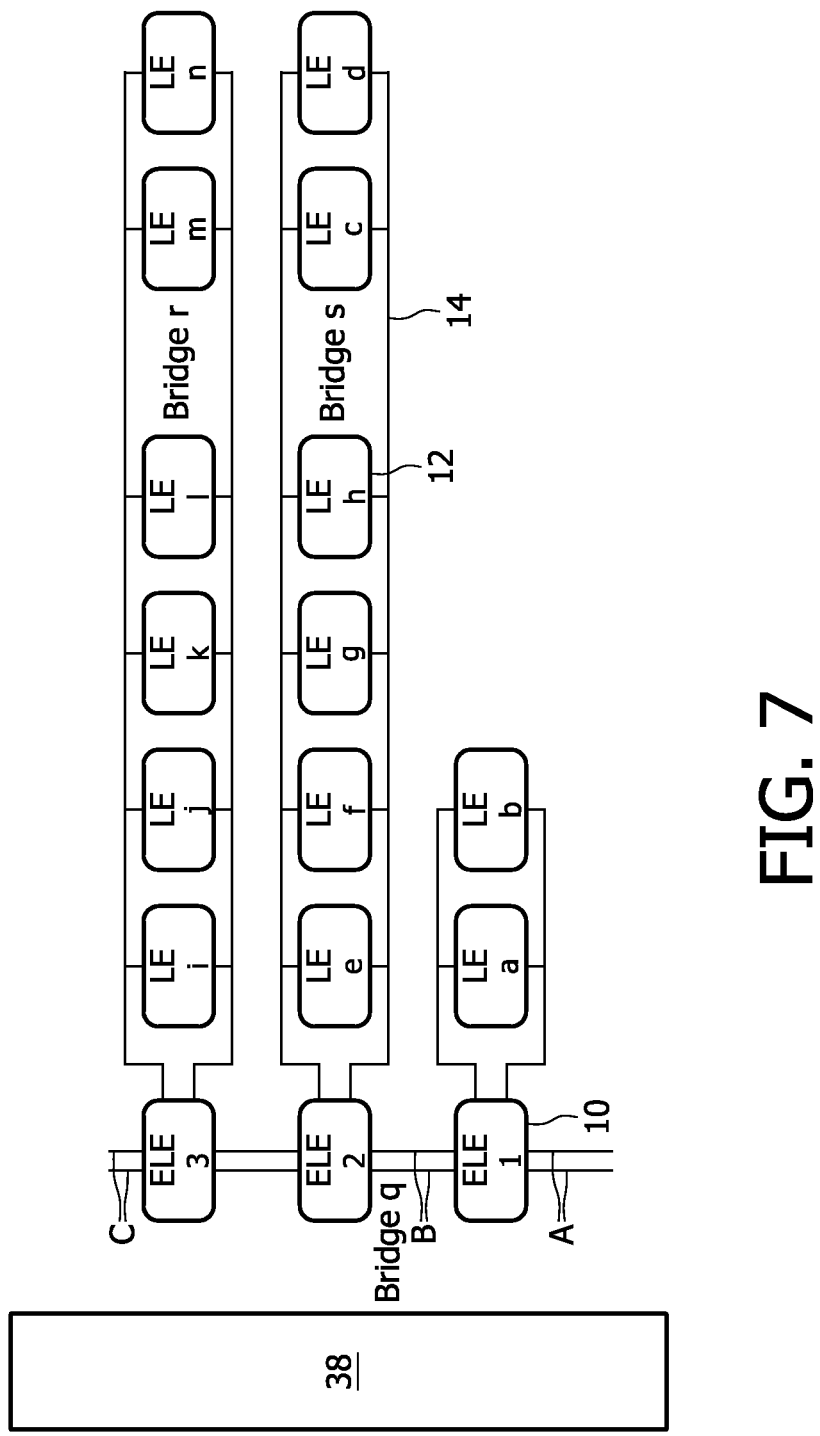

FIG. 1 is a schematic diagram of a number of electronic components comprising an end of line element and an associated group of line elements, FIG. 2 is a schematic diagram of the internal components of a line element of FIG. 1, FIG. 3 is a view similar to FIG. 1, showing multiple end of line elements and their associated groups of line elements, FIG. 4 is a schematic diagram of a fabric comprising a warp and weft of fibres, FIG. 5 is a schematic top view and two cross-sections of a portion of the fabric of FIG. 4, with an end of line element mounted thereon, FIG. 6 is a schematic diagram of a structure comprising a fabric with electronic components mounted thereon, and FIG. 7 is a schematic diagram showing the logical arrangement of the electronic components of FIG. 6.

The Figures show various aspects of the inventive structure which comprises a fabric with electronic components mounted thereon. FIG. 1 shows a logical arrangement of electronic components, which comprises an end of line element 10 and a corresponding of group of line elements 12, all of the line elements 12 of the group of line elements being connected to the end of line element 10 by a line 14.

The structure allows elements to be connected in more than one line. The lines have a means of communication and detection to determine how many elements are connected to a certain line, and each element in the line can still be individually addressed. Multiple lines can be connected together so that the layout is not limited to a single line.

FIG. 1 shows such a line 14 connecting the two types of elements 10 and 12. At one end of the line 14 is the end of line element 10. On the line 14 itself several line elements 12 are shown. The end of line element 10 provides power to the line 14 onto which the communication with the line elements 12 can be superimposed. The end of line element 10 is also able to determine how many line elements 12 are on the line 14. If each line element 12 is identified, they can be addressed individually, similarly to the elements in a matrix.

A more detailed view of a line element 12 is shown in FIG. 2, which is a block diagram of a line element 12. When power is supplied to the line element 12, the power detector 16 will connect the resistance 18 and the communication unit 20 to the line 14. By doing this, a means is provided for the end of line element 10 to see how many line elements 12 are on the line 14, and thus providing partial detection of power failure in the system.

The function unit 22 determines the functionality of a particular line element 12. For example, the function unit 22 may be used for measuring heart rate or respiration. The unit 22 may have a single dedicated function or it may be reconfigurable by the end of line element 10. By giving each line element 12 a unique identification 24, each of the line elements 12 can be addressed individually.

In the same way as an end of line element 10 can communicate with the line element 12 to which it is connected, the end of line elements 10 are also able to communicate with other end of line elements 10, in situation where more than one line 14 is provided. The end of line elements 10 will also have a unique id, which allows the different lines to be distinguished.

FIG. 3 shows a system which comprises multiple lines 14 connected to each other through the end of line elements 10. The electronic components in this design comprise a plurality of end of line elements 10 and a corresponding plurality of groups of line elements 12, each group of line elements 12 being connected to an end of line element 10. Each end of line element 10 is connected to an adjacent end of line element 10. The groups of line elements 12 are connected in parallel to their respective end of line element 10.

In FIG. 3, the two fault lines 26 indicate faults in the system. These faults can be detected because in all the lines the impedance on the line changes, and one end of line element 10 will not respond any more to communication initiated by the other end of line elements 10. Each end of line element 10 is arranged to query each line element 12, to which it is directly connected. This querying can be executed periodically to ascertain which line elements 12 are still functioning, and the control of the line elements 12 can be adapted accordingly.

The detection of faults in this way offers the opportunity for the system to try and see if the same functionality can be realised with the remaining elements 10 and 12. For instance, measuring heart rate at a non-optimal location on the body might also be sufficient in some situations. A fault in the power supply to the top end of line element 10 will be fatal for the system unless redundant connections for the power are added.

FIG. 4 shows a generic layout suitable for textiles. In this Figure, a fabric 28 comprises a warp and weft of fibres 30, each of the warp and weft comprising a combination of electrically conducting fibres and electrically non-conducting fibres. In this Figure, only the conducting fibres 30 have been shown, for clarity purposes. The wiring of the electronic components 10 and 12 as described above can be kept very simple. Because of this, a weaving compatible and generic layout can be made for a very wide range of systems. This layout has all conducting yarns in the warp and weft directions. The fabric 28 can be produced by conventional weaving, or produced by techniques such as embroidery, crochet, knitting, and even printing techniques, by depositing a conductive polymer or a metal onto the fabric substrate.

To clarify this, FIG. 5 shows a top view of an end of line element 10 mounted on the fabric 28, and two cross sections of fabric 28 with the end of line element 10. Each electronic component 10 or 12 is connected to at least one electrically conducting fibre 30. In FIG. 5, the end of line element 10 is of a cruciform shape and is connected to electrically conducting fibres 30 in both the warp and weft directions.

The cross-sectional diagrams in FIG. 5 show two alternative arrangements for the fabric 28. The two arrangements differ according to the number of non-conducting fibres 32 that are used in the warp. The non-conductive fibres 32 are used to keep separate the electrically conducting fibres 30, which are not insulated. This avoids short-circuiting in the structure. The fibres 32 each consist of a uniform material such as a simple plastic, for example, polyester or a natural material such as cotton. The electrically conducting fibres 30, which do not have an insulating coating, may comprise a suitable metal fibre or metal alloy fibre such as a steel fibre with a silver coating.

The actual number of non-conducting fibres 32 used in the fabric 28 is a matter of design choice and depends upon the material used for the fibres 30 and 32, and the garment or article for which the fabric 28 will be ultimately used. When using only two layers in a woven structure, floatations will appear. For a woven structure with three or more layers, floatations can be avoided. The layout of FIG. 4 is not limited to two or three layers, more can be used. In general floatations are undesirable for a fabric. They have a high risk of being caught behind a sharp object. It is generally preferred to avoid floatations, especially in the conductive lines of the electronic textile, since having floatations increases the chance that an electronic connection is damaged over time.

In addition to the end of line elements 10 and the groups of line elements 12, the components used in the structure can also include at least one electrically conductive bridge component, which is used to connect a pair of electrically conducting fibres 30. These fibres being connected may be close together or may be separated by a significant portion of the fabric 28. The bridge components are used to enhance the possibilities of the shape of the fabric 28 that can be used. This supports the cutting to fit nature of the fabric 28 which can be shaped as desired by the end application, with the electronic components being added following the cutting of the fabric 28.

Using the layout of fabric from FIG. 4 and the three component types end of line elements 10, line elements 12 and bridges, a very wide variety of systems can be made with arbitrary shapes. FIG. 6 shows such an example of shape that can be generated. The fabric of FIG. 6 is the same as shown in FIG. 4. In the Figure, a certain shape is cut from the fabric 28. This is indicated by the black dotted line 34.

On the shape cut from the fabric 28, a certain electronic system is constructed by connecting end of line elements 10, line elements 12 and bridges 36 to the fabric 28 in a particular way. The method of manufacture of the structure is such that the end of line elements 10, line elements 12 and bridges 36 can be added to the fabric before or after the cutting of the fabric 28, depending on which is more convenient for the specific application.

The end of line elements 10 and the line elements 12 are as discussed above, with the new element of the bridge 36 being used in three different places in the design shown in FIG. 6. The bridge 36 is a component that connects several columns or rows together. In its simplest form, the bridge component will join together a pair of conducting fibres 30, but in practice, in most applications, multiple fibres 30 will be joined together.

For example, the bridge (labelled q) in FIG. 6 connects "column" fibre C0 to fibre C2 and fibre C1 to fibre C3. A similar bridge r connects "row" fibre R5 to fibre R3 and fibre R4 to fibre R2. If the pitch between the column and row fibres is the same, only one bridge type is needed, whether rows or columns are being joined.

The structure shown in FIG. 6, when cut, will further comprise a power source connected to a pair of the electrically conducting fibres 30 for supplying power to the electronic components. The power source will be connected to multiple independent pairs of electrically conducting fibres 30 to increase the robustness of the design.

FIG. 7 shows the electrical equivalent of the system shown in FIG. 6. After the fabric has been cut, there are several different possibilities for connecting the power supply 38 to the system. These possibilities are shown in FIGS. 6 and 7 at the edge of the fabric by the letters A, B and C. In theory only one of the points A, B or C needs to be connected to the power supply 38 for the system to operate. Given however that textiles are susceptible to wear and tear it is advised to use all connections if possible to improve the fault tolerance of the system.

The field of application of the structure described above is wearable and textile electronics. The structure described is especially useful in situations were cut to measure of the fabric is important. The structure supports cut to measure of electronic textiles with the partial detection of power and component failure and with a generic textile design layout.

The invention claimed is:

1. A structure comprising:
a fabric comprising a warp and weft of fibres, each of the warp and weft comprising a combination of electrically conducting fibres and electrically non-conducting fibres,
wherein a plurality of warp and wefts combine to form a woven structure having a first and second side;
a plurality of electronic components mounted onto the fibres on the first side, each electronic component connected to at least one electrically conducting fibre;
at least one electrically conductive bridge component connecting a pair of electrically conducting fibres; and
a plurality of end of line elements, wherein each of the plurality of end of line elements is connected in parallel to a discrete plurality of line elements, wherein there is no direct connection between any of the discrete pluralities of line elements,
wherein at least one line element is reconfigurable from a first sensing functionality to a second sensing functionality,
wherein each of the plurality of end of line elements is configured to:
assign a unique identification to each connected line element, and
reconfigure each connected reconfigurable line element.

2. The structure according to claim 1, wherein each of the plurality of end of line elements is further configured to query each connected line element by its unique identification to assess which connected line elements are functioning.

3. The structure according to claim 1, and further comprising a power source-connected to a pair of electrically conducting fibres.

4. The structure according to claim 3, wherein the power source is connected to multiple independent pairs of electrically conducting fibres.

5. The structure according to claim 1, wherein the fabric is adapted to mount the plurality of electronic components and the electrically conductive bridge component after the outermost edge of the fabric is cut into a certain shape.

6. The structure according to claim 1, wherein the end of line elements, the line elements, and the electrically conductive bridge components are all separate elements.

7. The structure according to claim 1, wherein the electrically conductive bridge components are separate from the combination of electrically conducting fibres.

8. The structure according to claim 7, wherein the electrically conductive bridge components connect at least three electrically conducting fibres.

9. The structure according to claim 1, wherein the woven structure comprises three or more layers of fibers.

10. The structure according to claim 3, wherein the power source is connected to the fabric at three or more points.

11. The structure according to claim 1, wherein the fabric is clothing for a human.

12. The structure according to claim 11, wherein the first and second sensing functionalities are for measuring biomedical characteristics of the human.

13. The structure according to claim 2, wherein each of the plurality of end of line elements is arranged to communicate line element functionality and configuration information to each other of the plurality of end of line elements.

14. The structure according to claim 13, wherein a first line element is reconfigured to perform the function of a second line element when the second line element is queried and determined to be nonfunctioning.

* * * * *